(12) United States Patent
Sudo

(10) Patent No.: US 8,785,325 B2
(45) Date of Patent: Jul. 22, 2014

(54) METHOD OF MANUFACTURING SEMICONDUCTOR DEVICE

(75) Inventor: Gaku Sudo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 13/233,379

(22) Filed: Sep. 15, 2011

(65) Prior Publication Data

US 2012/0205750 A1    Aug. 16, 2012

(30) Foreign Application Priority Data

Feb. 14, 2011 (JP) ................................ 2011-028660

(51) Int. Cl.
*H01L 21/469* (2006.01)
*H01L 21/311* (2006.01)
*H01L 21/32* (2006.01)

(52) U.S. Cl.
USPC 438/700; 438/671; 257/E21.24; 257/E21.257; 257/E21.314

(58) Field of Classification Search
CPC ............ H01L 21/0332; H01L 21/0337; H01L 21/0338; H01L 21/3086; H01L 21/3088; H01L 21/3114; H01L 21/32139; H01L 21/76811; H01L 21/76816; C25D 1/003
See application file for complete search history.

(56) References Cited

U.S. PATENT DOCUMENTS

| | | | |
|---|---|---|---|
| 7,576,010 B2 | 8/2009 | Lee et al. | |
| 2006/0234166 A1 | 10/2006 | Lee et al. | |
| 2007/0123037 A1* | 5/2007 | Lee et al. | 438/636 |
| 2009/0130851 A1* | 5/2009 | Hasegawa et al. | 438/694 |
| 2009/0286401 A1 | 11/2009 | Ichinose et al. | |

FOREIGN PATENT DOCUMENTS

| | | |
|---|---|---|
| JP | 2006-303500 | 11/2006 |
| JP | 2009-130035 | 6/2009 |
| JP | 2009-278039 | 11/2009 |
| KR | 10-2009-0127338 | 12/2009 |
| TW | 200845125 A | 11/2008 |

OTHER PUBLICATIONS

Notification for Filing Opinion issued by the Korean Patent Office on Mar. 12, 2013, for corresponding Korean Patent Application No. 10-2011-93131.
Taiwanese Office Action dated Oct. 17, 2013 for Taiwanese Application No. 100132485.

* cited by examiner

*Primary Examiner* — Zandra Smith
*Assistant Examiner* — Pamela E Perkins
(74) *Attorney, Agent, or Firm* — Finnegan, Henderson, Farabow, Garrett & Dunner, LLP

(57) ABSTRACT

According to one embodiment, a method of manufacturing a semiconductor device, the method includes forming first and second cores on a processed material, forming a covering material having a stacked layer includes first and second layers, the covering material covering an upper surface and a side surface of the first and second cores, removing the second layer covering the first core, forming a first sidewall mask having the first layer on the side surface of the first core and a second sidewall mask having the first and second layers on the side surface of the second core by etching the covering material, removing the first and second cores, and forming first and second patterns having different width in parallel by etching the processed material in condition of using the first and second sidewall masks.

18 Claims, 18 Drawing Sheets

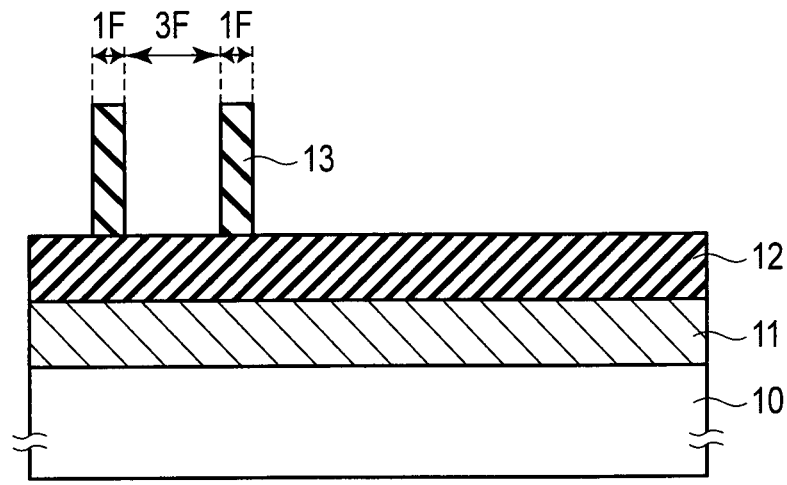
F I G. 1 C
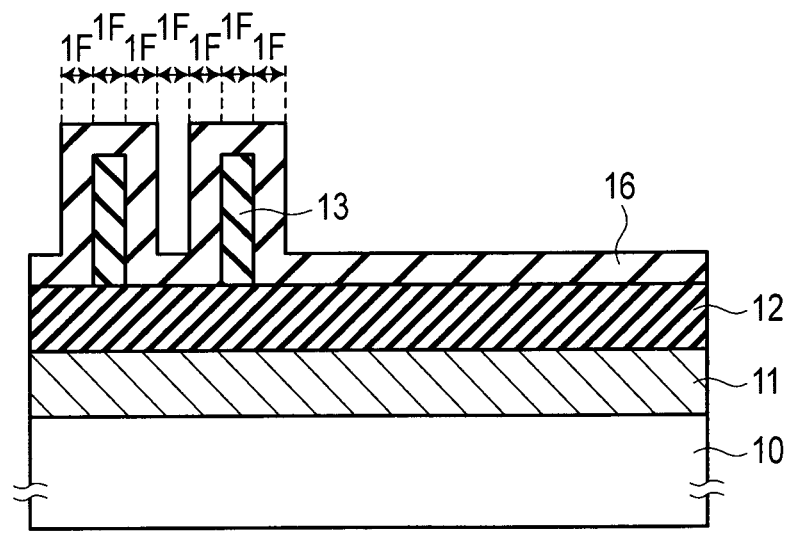
F I G. 1 D

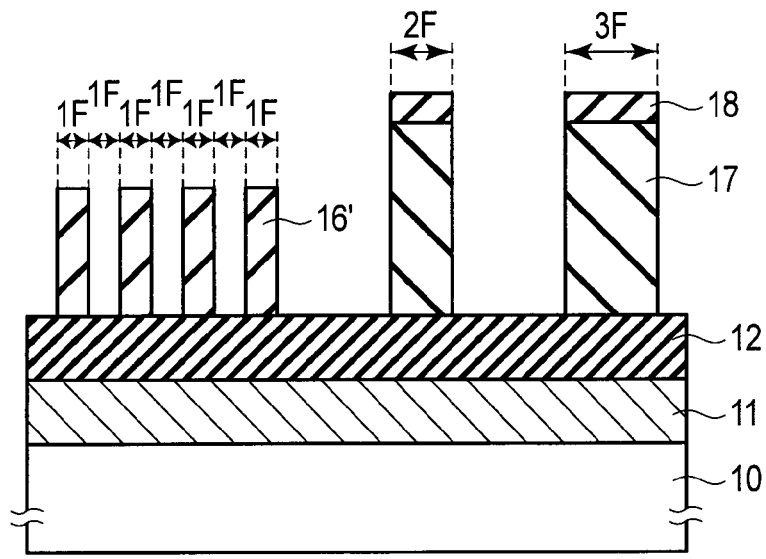
F I G. 1 G
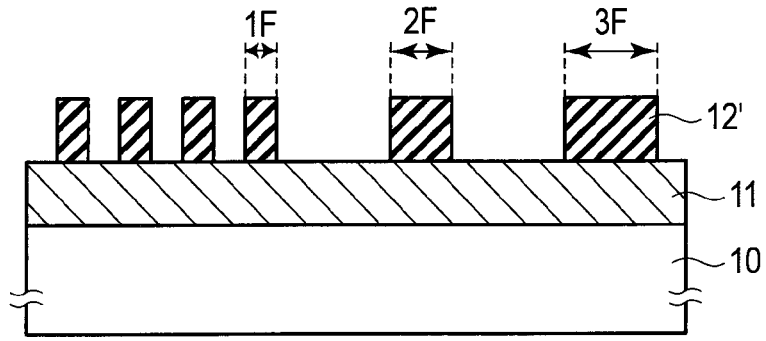
F I G. 1 H
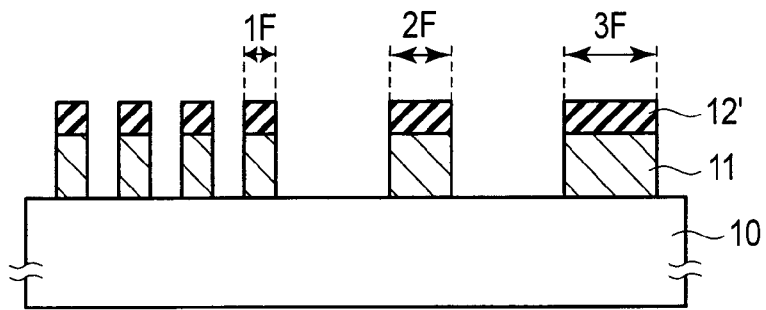
F I G. 1 I

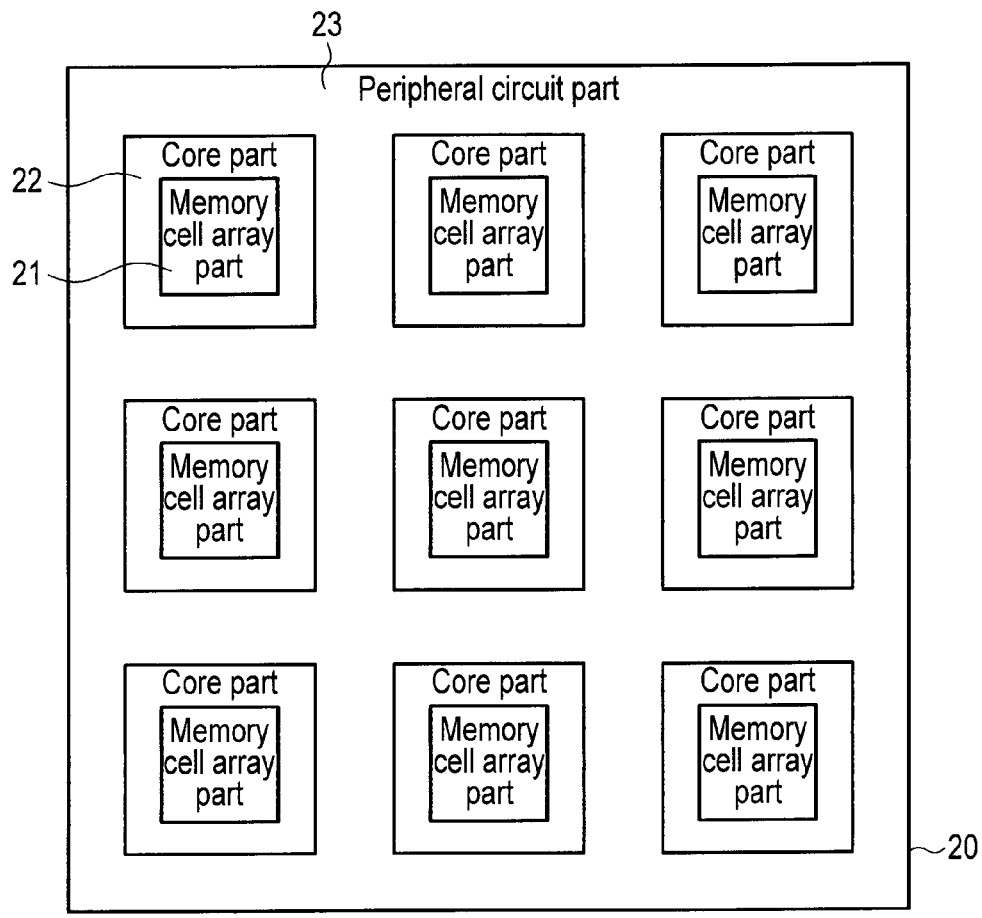
F I G. 3
F I G. 4

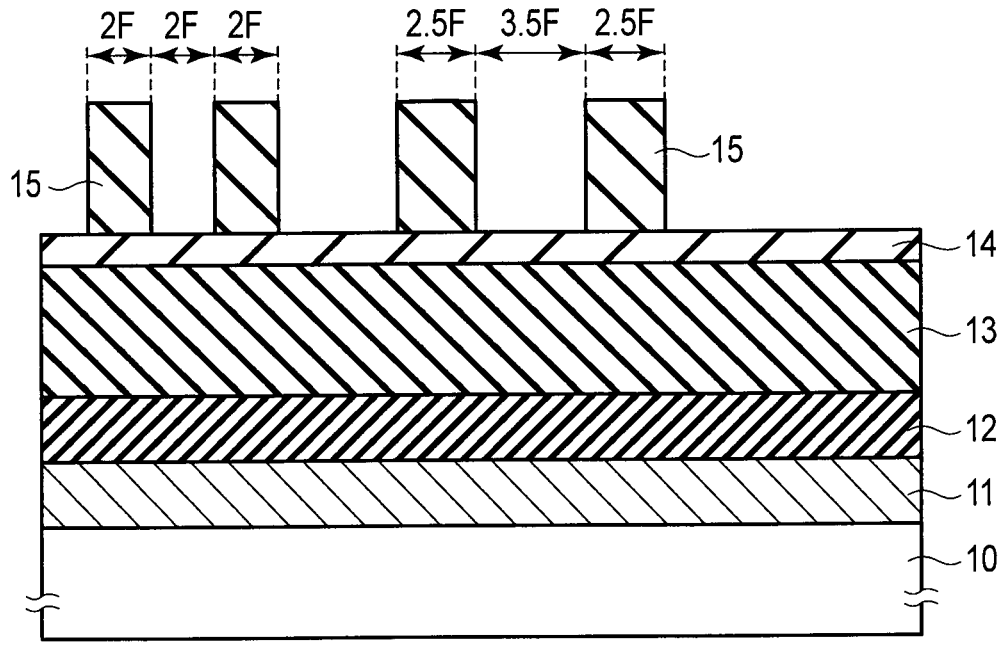
F I G. 5 A
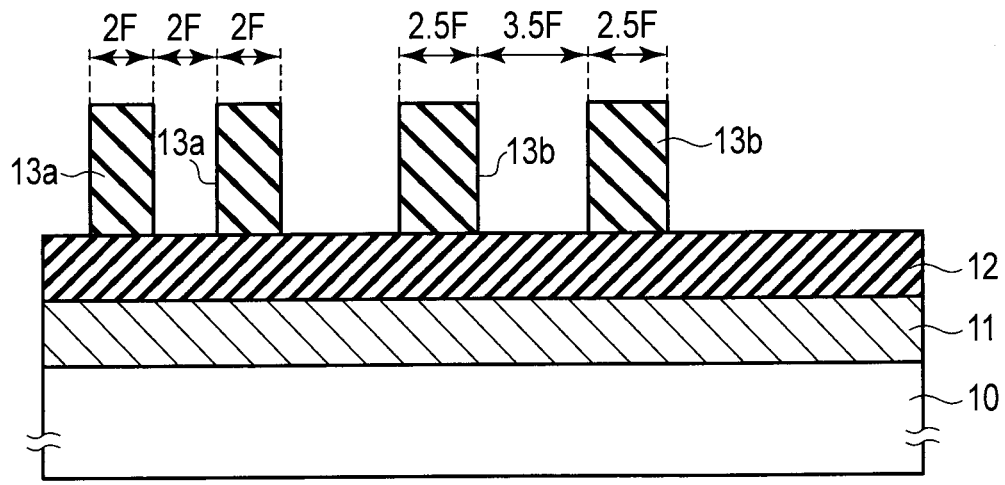
F I G. 5 B

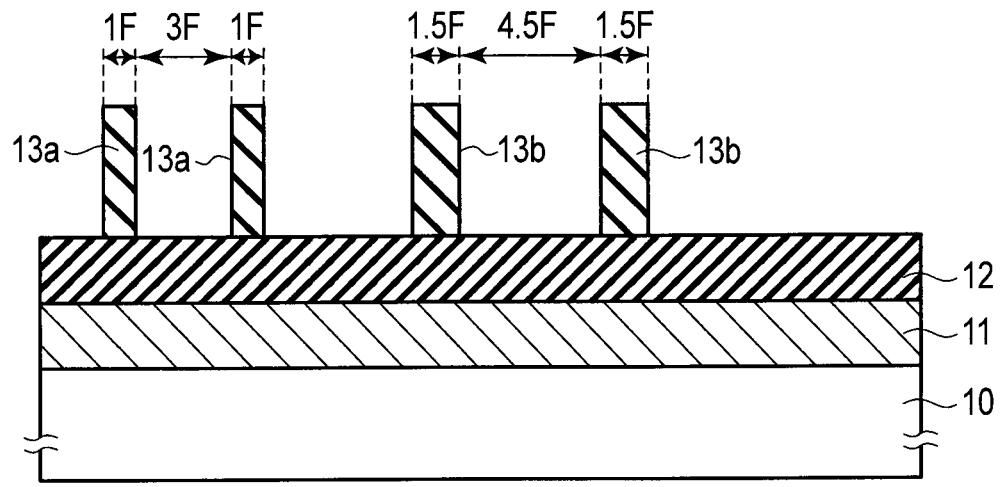
F I G. 5 C
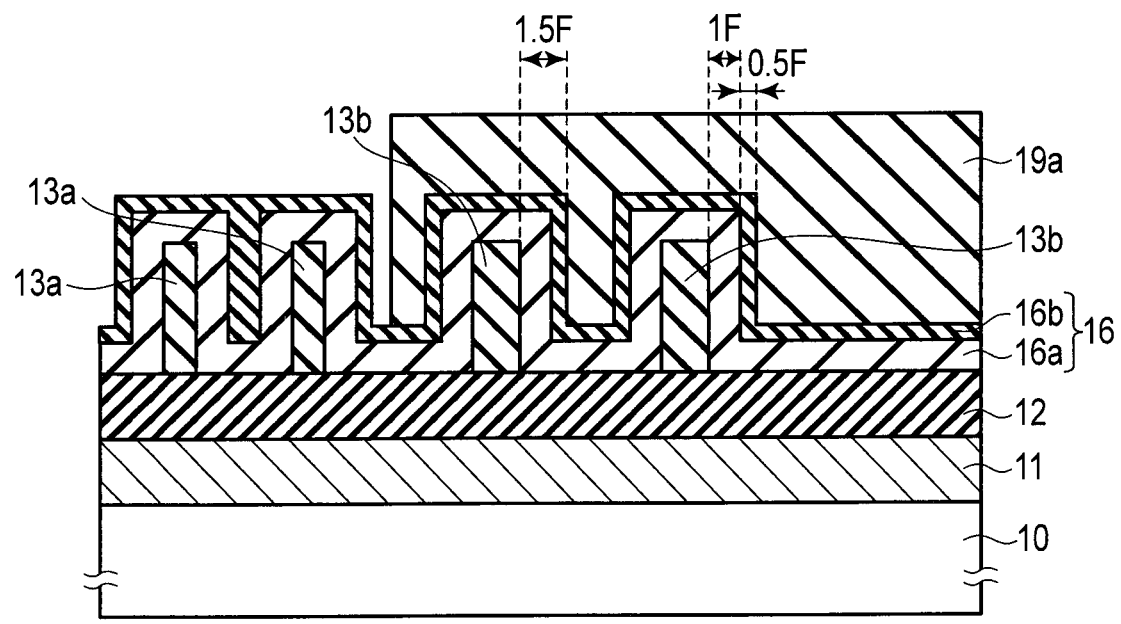
F I G. 5 D

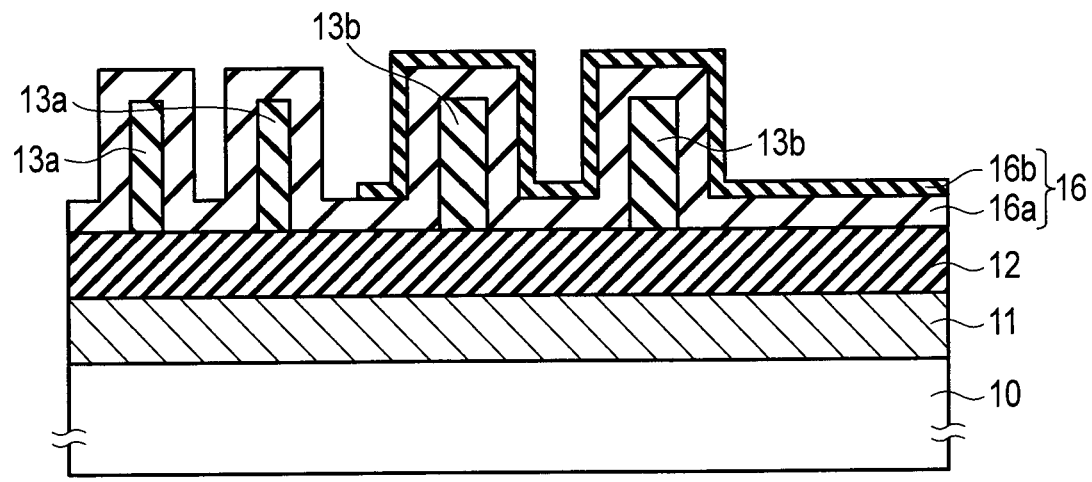
F I G. 5 E
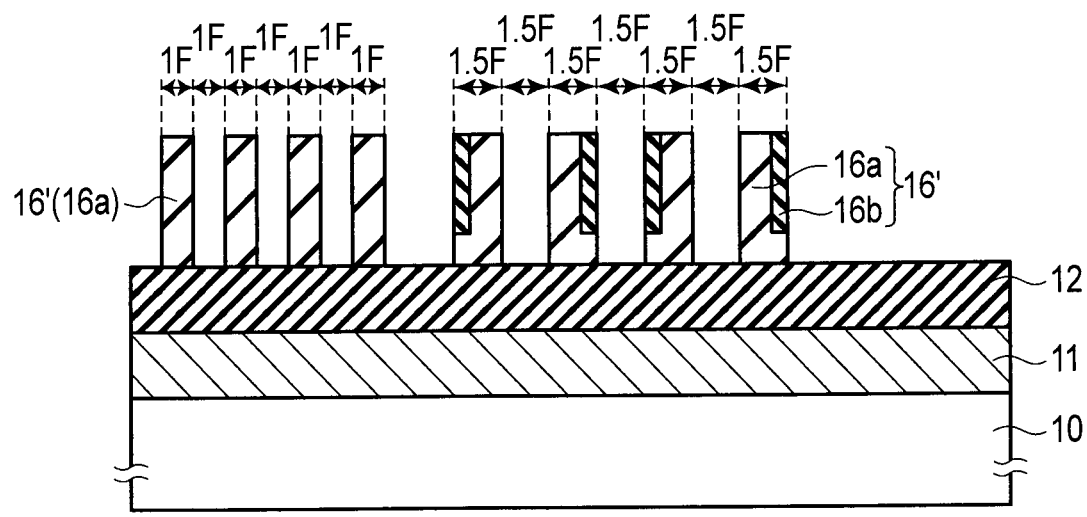
F I G. 5 F

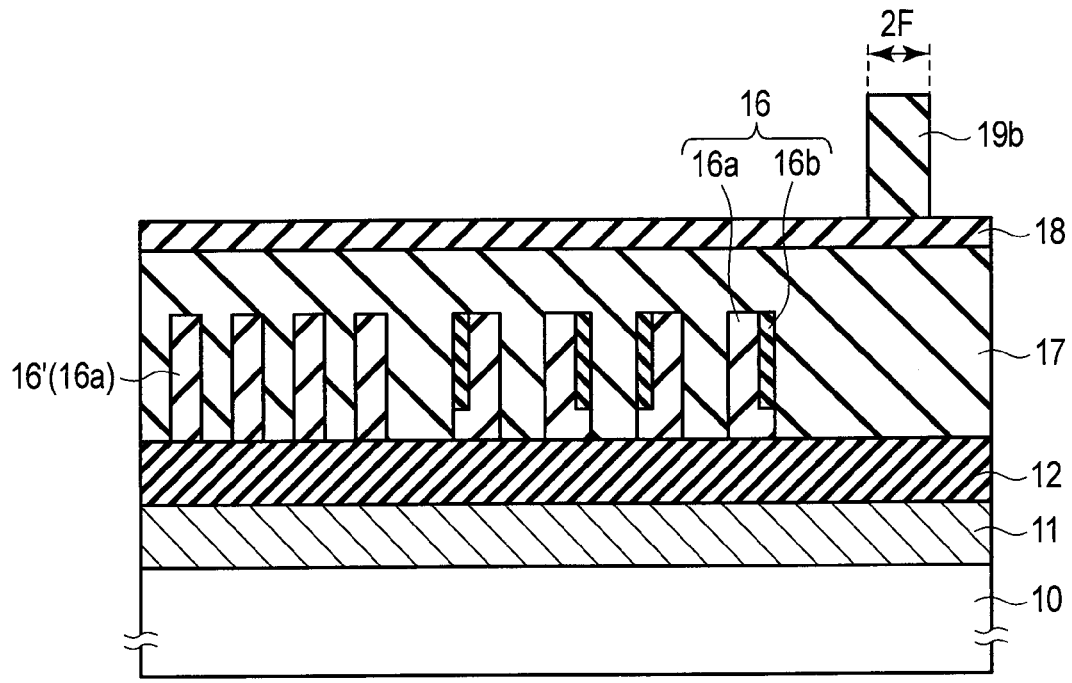
F I G. 5 G
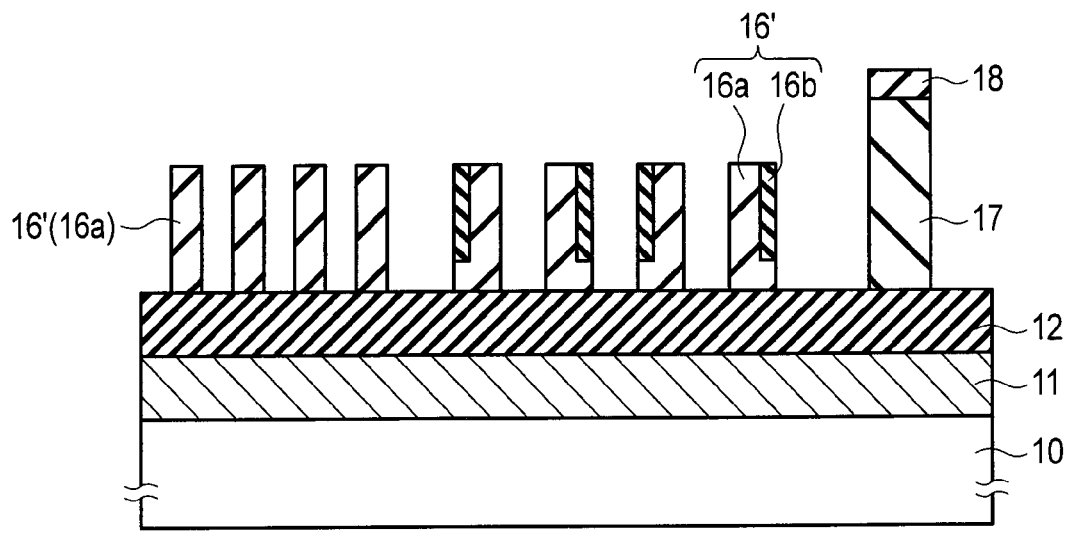
F I G. 5 H

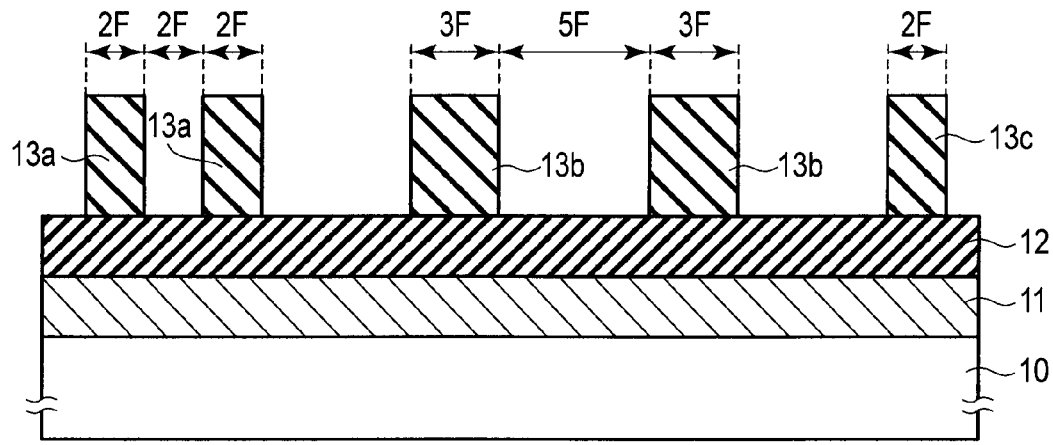
F I G. 6 B
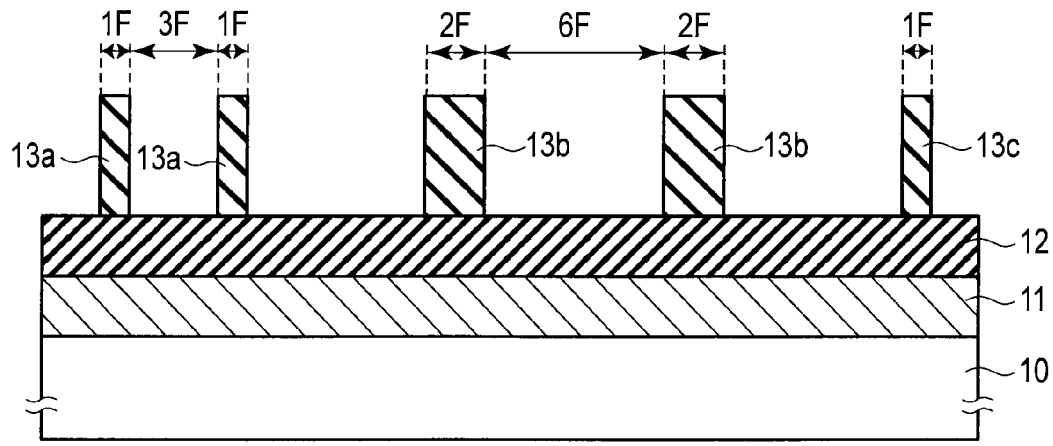
F I G. 6 C

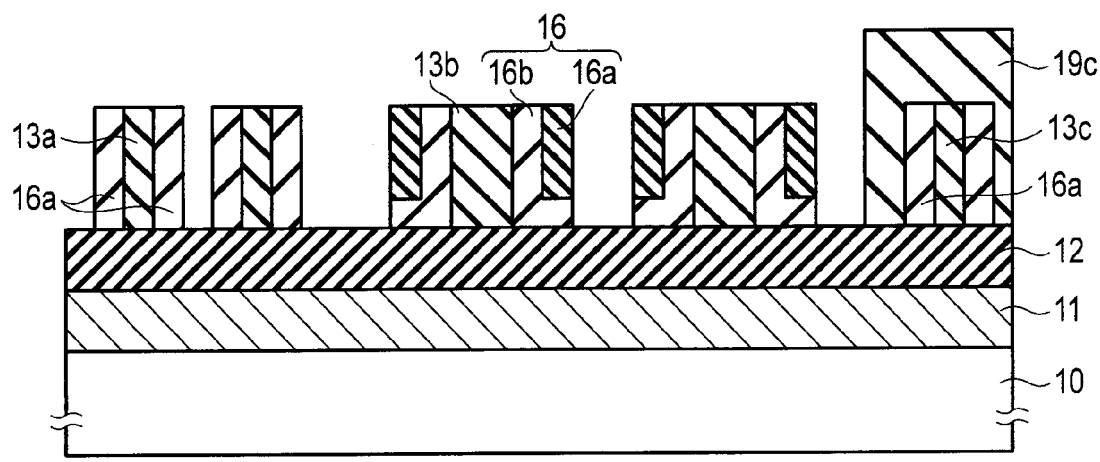
F I G. 6 F
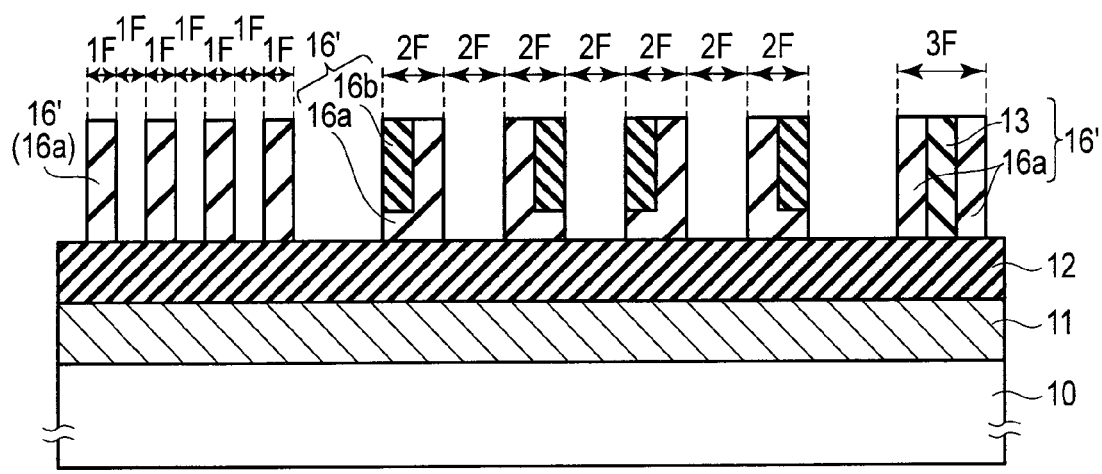
F I G. 6 G

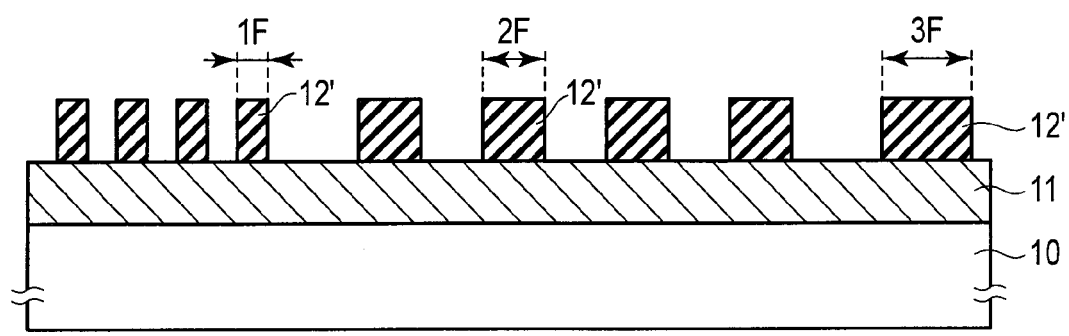
F I G. 6 H
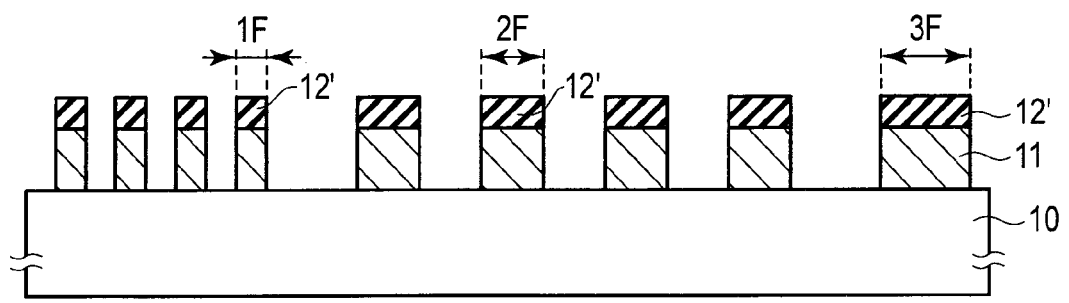
F I G. 6 I

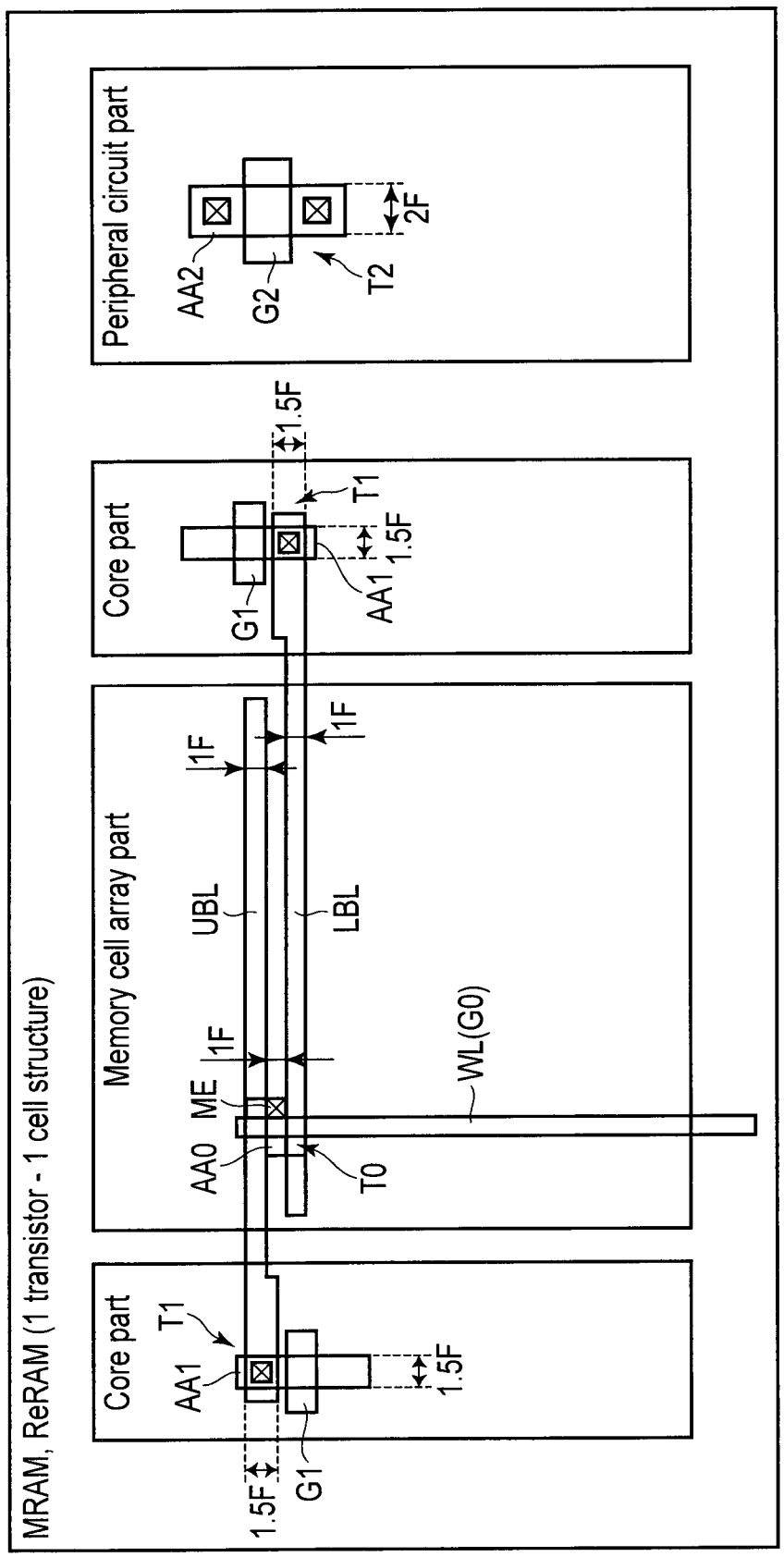
F I G. 8

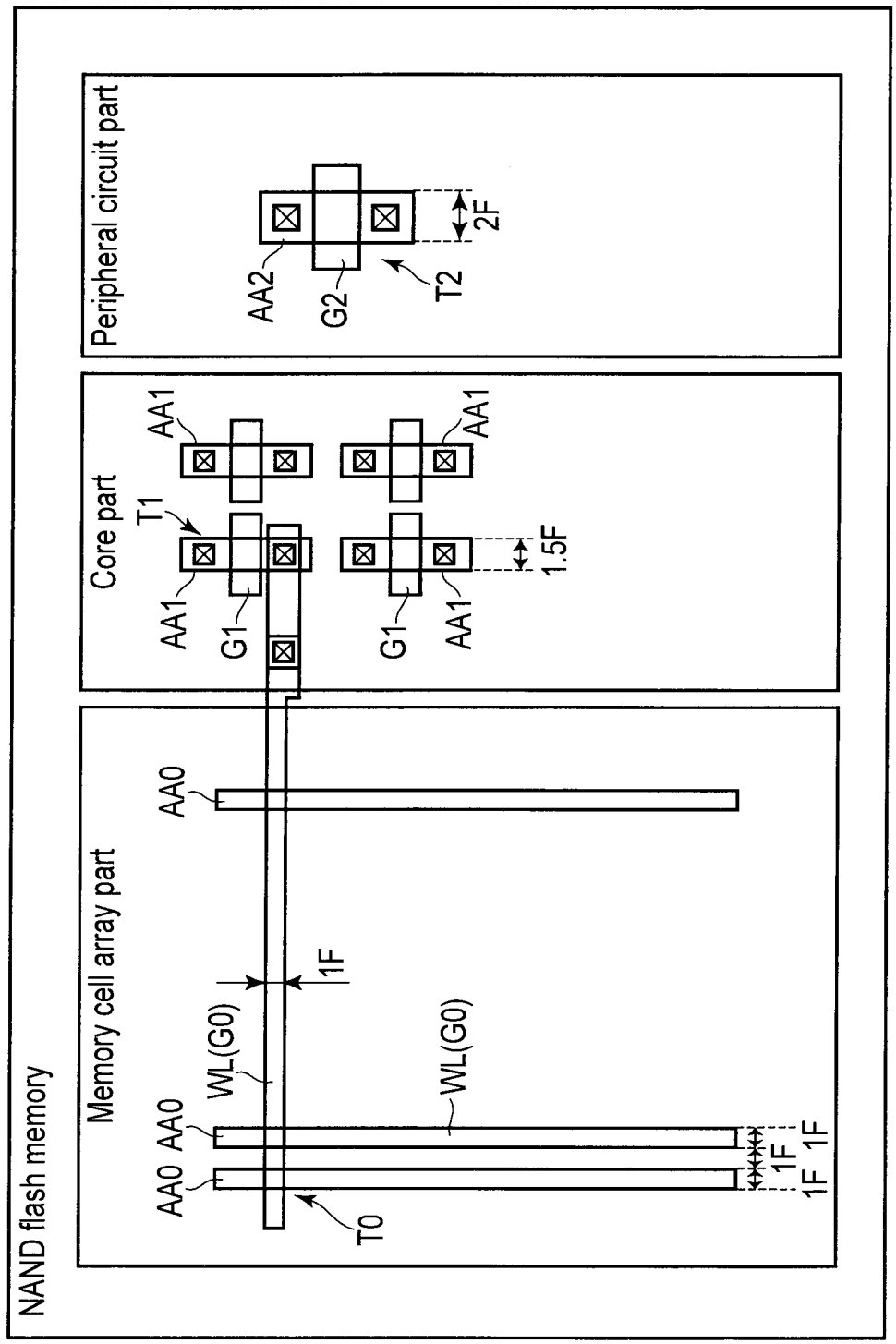
F I G. 9

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2011-028660, filed Feb. 14, 2011, the entire contents of which are incorporated herein by reference.

FIELD

Embodiments described herein relate generally to a method of manufacturing a semiconductor device.

BACKGROUND

A sidewall mask process (or a double patterning process) is known as a semiconductor process technology. This process is characterized in that a pattern smaller than a minimum processing size by photolithography can be formed. According to the process, even if the photolithography size is reduced, variations in width of processed patterns do not arise and thus, the process is promising, for example, for processing of an active area and a gate electrode in which a miniaturization is conspicuous. However, according to the sidewall mask process, patterns having different widths cannot be formed in parallel.

BRIEF DESCRIPTION OF THE DRAWINGS

FIGS. 1A to 1I are diagrams showing a method of manufacturing a reference example;
FIG. 3 is a diagram showing a semiconductor device having memory core parts;
FIG. 4 is a diagram showing a pattern width;
FIGS. 5A to 5J are diagrams showing the method of manufacturing of a first embodiment;
FIGS. 6A to 6I are diagrams showing the method of manufacturing of a second embodiment;
FIG. 8 is a diagram showing a first application example;
and
FIG. 9 is a diagram showing a second application example.

DETAILED DESCRIPTION

In general, according to one embodiment, a method of manufacturing a semiconductor device, the method comprising: forming first and second cores on a processed material; forming a covering material having a stacked layer comprising first and second layers, the covering material covering an upper surface and a side surface of the first and second cores; removing the second layer covering the first core; forming a first sidewall mask having the first layer on the side surface of the first core and a second sidewall mask having the first and second layers on the side surface of the second core by etching the covering material; removing the first and second cores; and forming first and second patterns having different width in parallel by etching the processed material in condition of using the first and second sidewall masks.

The embodiments will be described below with reference to the drawings.

FIGS. 1A to 1I show a method of manufacturing a reference example.

Here, an example in which a line-and-space pattern of a half-pitch 1 F is formed by the sidewall mask process when the minimum processing size by photolithography is 2 F will be described.

Figure 1A:
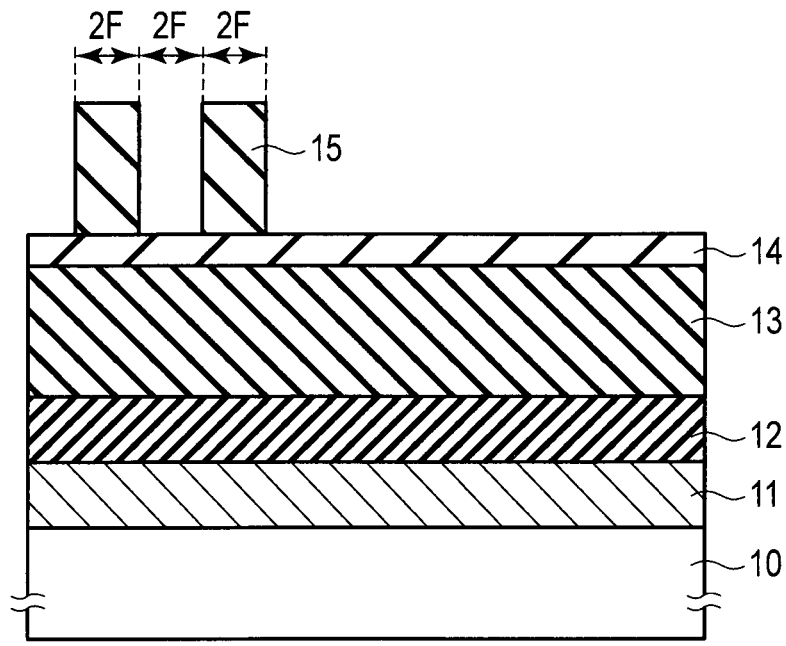

First, as shown in FIG. 1A, processed materials 11, 12 are formed on semiconductor substrate 10. Subsequently, core 13 and antireflection material 14 are formed on processed materials 11, 12. Then, resist pattern 15 of the half-pitch 2 F (line width: 2 F, space width: 2 F) is formed on antireflection material 14 by photolithography.

Figure 1B:
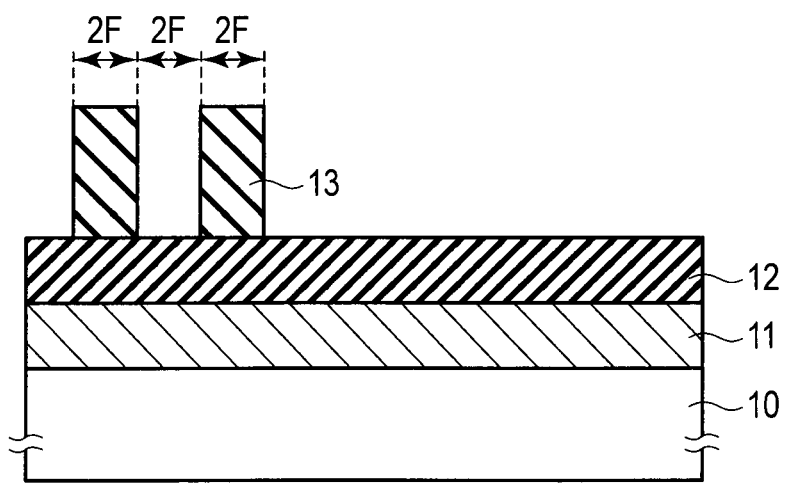

If resist pattern 15 is removed after antireflection material 14 and core 13 being etched in condition of using resist pattern 15 and further antireflection material 14 is removed, resist pattern 15 is transferred to core 13. That is, as shown in FIG. 1B, core 13 has a line-and-space pattern of the half-pitch 2 F (line width: 2 F, space width: 2 F).

Next, as shown in FIG. 1C, slimming processing of core 13 is performed to set the line width of core 13 to 1 F and the space width between cores 13 to 3 F.

Figure 1E:
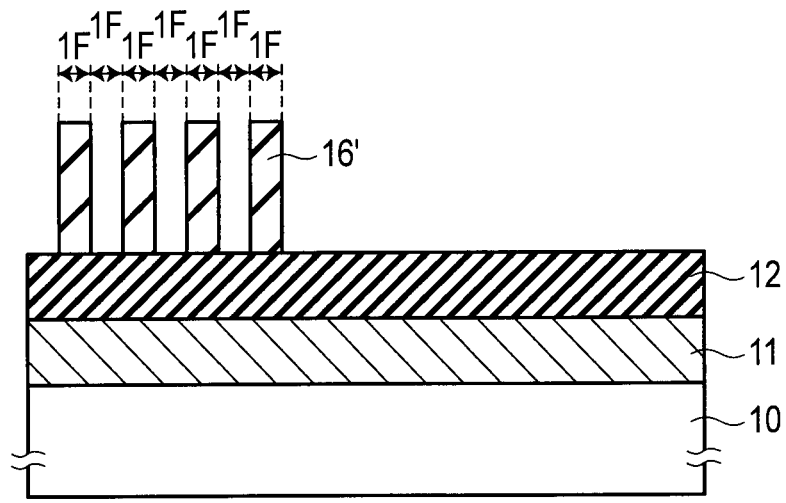

Next, as shown in FIG. 1D, covering material 16 to cover an upper surface and a side surface of core 13 is formed. Covering material 16 is etched by RIE in such a way that covering material 16 is left on the side surface of core 13. Then, core 13 is removed to form, as shown in FIG. 1E, side masks 16' having a line-and-space pattern of the half-pitch 1 F (line width: 1 F, space width: 1 F).

Figure 1F:
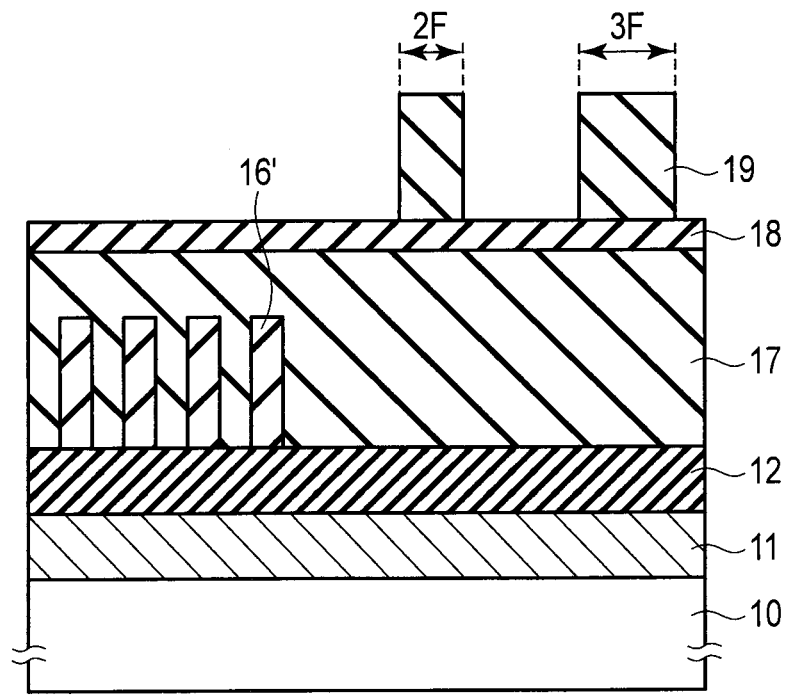

Next, as shown in FIG. 1F, mask materials 17, 18 are formed again on processed materials 11, 12. Subsequently, resist patterns 19 of line widths 2 F, 3 F are formed on mask materials 17, 18 by photolithography.

If mask materials 17, 18 are etched in condition of using resist pattern 19 and then resist pattern 19 is removed, resist pattern 19 is transferred to mask materials 17, 18. That is, as shown in FIG. 1G, mask materials 17, 18 have line widths 2 F, 3 F.

Then, if processed material 12 is etched by RIE in condition of using sidewall mask 16' and mask materials 17, 18 and then sidewall mask 16' and mask materials 17, 18 are removed, as shown in FIG. 1H, the processed material is processed to, for example, hard masks 12' having different line widths 1 F, 2 F, 3 F.

Lastly, as shown in FIG. 1I, processed material 11 is etched by RIE in condition of using hard mask 12'.

According to the above sidewall mask process, a line-and-space pattern of the half-pitch 1 F can be formed when the minimum processing size by photolithography is 2 F. However, the line width that can be formed by the process is 1 F only. For example, the sidewall mask process is not applied to patterns of line width 2 F or 3 F.

Figure 2:
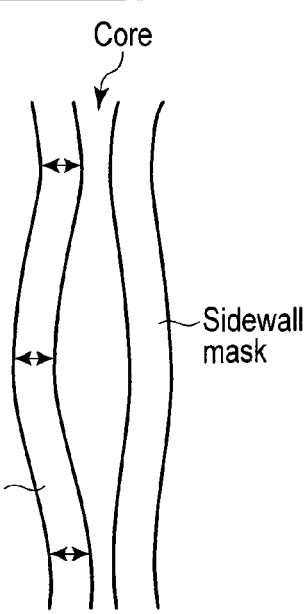
FIG. 2 is a diagram showing line width roughness.

In this case, as shown in FIG. 2, no sidewall mask process is available for patterns of line widths 2 F and 3 F so that variations in line width (for example, the gate width) caused by fluctuations of photolithography do not arise. This is called line width roughness.

When the sidewall mask process is available, by contrast, line width roughness is not generated on a sidewall mask formed on the side surface of the core even if line width roughness is generated on the core. Therefore, when the minimum processing size by photolithography is 2 F, it is more desirable to be able to form a pattern of line width 1 F and a pattern of line width 2 F or more in parallel by the sidewall mask process.

In recent years, when a line-and-space pattern of the half-pitch 1 F is formed from the minimum processing size 2 F by photolithography, there are situations when, in addition to the line-and-space pattern, a pattern whose line width exceeding 1 F and less than 2 F (for example, a pattern whose line width is 1.5 F) needs to be formed in parallel.

For example, in a semiconductor memory in which memory cell array parts 21 are arranged on a semiconductor substrate (chip area) 20, as shown in FIG. 3, memory cell array part 21 may be patterned by using a mask material whose line width is W1 (=1 F) and core part 22 arranged adjacent to memory cell array part 21 may be patterned by using a mask material whose line width is W2 (1 F<W2<2 F).

That is, to prevent deterioration of characteristics caused by the parasitic capacitance, voltage drop or the like in a semiconductor memory such as the MRAM, ReRAM, and NAND flash memory, it is desirable to form as many the memory cell array parts 21 as possible on one chip to minimize the size of memory cell array part 21.

In this case, the size (gate width of FET) of a driver arranged in core part 22 can be made smaller than the size of FET in peripheral circuit part 23 and it is very effective to pattern core part 22 by using a mask material whose line width is W2 from the viewpoint of reducing a chip area.

Thus, in the following embodiments, a technology capable of making the width of a sidewall mask variable by forming a covering material composed of layers on the side surface of a core and then using the layers as a sidewall mask or after selectively removing at least one layer from the layers to use the remaining layers as a sidewall mask is proposed.

For example, if a covering material having a stacked layer comprising first and second layers to cover the upper surface and side surface of first and second cores is formed and then the second layer covering the first core is selectively removed, a first sidewall mask having the first layer (first width) on the side surface of the first core is formed and a second sidewall mask having the first and second layers (second width) on the side surface of the second core is formed by RIE.

Alternatively, if a covering material having a stacked layer comprising first and second layers to cover the upper surface and side surface of a core is formed and then the second layer covering a first part of the core is removed, a first sidewall mask having the first layer (first width) on the side surface of the first part of the core is formed and a second sidewall mask having the first and second layers (second width) on the side surface of a second part of the core is formed by RIE.

Thus, a single pattern or patterns having different widths can be formed in parallel by the sidewall mask process and therefore, a process effective for next-generation semiconductor memories such as MRAM and ReRAM and NAND flash memories can be realized by forming widths smaller than the minimum processing size by photolithography in parallel.

For example, as shown in FIG. 4, a line-and-space pattern (half-pitch: 1 F) of the memory cell array part, a pattern (pattern width: 1.5 F) of the core part, and a pattern (pattern width: 2 F, 3 F) of the peripheral circuit part can be formed by the sidewall mask process in parallel.

FIGS. 3 and 4 correspond to each other. Patterns of the memory cell array part, the core part, and the peripheral circuit part shown in FIG. 4 may be an active area, conductive line, and gate electrode of FET respectively.

A width of the minimum processing size by photolithography or more can also be formed in parallel with a width smaller than the minimum processing size by photolithography by the sidewall mask process without increasing the number of manufacturing processes (without increasing manufacturing costs) and therefore, improvement of reliability can be realized by improving accuracy of dimension without line width roughness being generated on patterns of the minimum processing size by photolithography or more.

FIGS. 5A to 5J show the method of manufacturing of the first embodiment.

Here, an example in which a pattern of line width W1 (=1 F) and a pattern of line width W2 (1 F<W2<2 F) are formed in parallel by the sidewall mask process when the minimum processing size by photolithography is 2 F.

First, as shown in FIG. 5A, processed materials 11, 12 are formed on semiconductor substrate 10.

In this example, an example of processed materials 11, 12 will be described, but semiconductor substrate 10 may also be patterned as a processed material together with processed materials 11, 12 or semiconductor substrate 10 may be patterned as a processed material by omitting processed materials 11, 12.

Processed materials 11, 12 may be conductive materials or insulating materials. Processed materials 11, 12 may also be resistors (including variable resistors). Each of processed materials 11, 12 may further be composed of layers.

Subsequently, core 13 and antireflection material 14 are formed on processed materials 11, 12.

Core 13 is constituted of, for example, tetraethoxysilane (TEOS), $SiO_2$, SiN, C or the like. The material and thickness of core 13 are decided in consideration of etching selectivity with respect to processed materials 11, 12 and covering materials 16a, 16b (FIG. 5D).

Then, resist pattern 15 of line width 2 F and the space width 2 F and resist pattern 15 of line width 2.5 F and the space width 3.5 F are formed on antireflection material 14 by photolithography.

If resist pattern 15 is removed after antireflection material 14 and core 13 being etched in condition of using resist pattern 15 and further antireflection material 14 is removed, resist pattern 15 is transferred to core 13. That is, as shown in FIG. 5B, first core 13a has a pattern of line width 2 F and the space width 2 F and second core 13b has a pattern of line width 2.5 F and the space width 3.5 F.

Next, as shown in FIG. 5C, slimming processing of first and second cores 13a, 13b is performed to set the line width of first core 13a to 1 F and the space width thereof to 3 F and the line width of second core 13b to 1.5 F and the space width thereof to 4.5 F.

The slimming processing is performed by wet etching, dry etching, or a combination of wet etching and dry etching.

In the present example, antireflection material 14 and resist pattern 15 in FIG. 5A are removed before the slimming processing, but may also be removed after the slimming processing. Antireflection material 14 and resist pattern 15 in FIG. 5A are removed by, for example, $O_2$ plasma etching. Antireflection material 14 and resist pattern 15 in FIG. 5A may be removed in parallel or separately.

Next, as shown in FIG. 5D, covering material 16 covering the upper surface and side surface of first and second cores 13a, 13b is formed. Covering material 16 is constituted of two layers or more. In the present example, covering material 16 is composed of first layer (lower-layer wall material) 16a and second layer (upper-layer wall material) 16b.

The thickness of first layer 16a is 1 F and the thickness of second layer 16b is 0.5 F. First layer 16a and second layer 16b are constituted of different materials having etching selectivity. As described above, it is necessary for first and second layers 16a, 16b to have etching selectivity also with respect to core 13 and processed materials 11, 12.

For example, one of first and second layers 16a, 16b is amorphous silicon including impurities (for example, boron) and the other is amorphous silicon including no impurity. If covering material 16 has a stacked structure of three layers or more including first and second layers 16a, 16b, it is desirable for each layer of the stacked structure to be one selected from amorphous silicon including impurities, amorphous silicon including no impurity, and an insulating material.

If second layer 16b of covering layer 16 is amorphous silicon including no impurity and first layer 16a of covering layer 16 is amorphous silicon including impurities, etching selectivity of first and second layers 16a, 16b can be set large by using an alkaline solution so that only second layer 16b can selectively be removed.

If second layer 16b of covering layer 16 is $SiO_2$ and first layer 16a of covering layer 16 is amorphous silicon including impurities or amorphous silicon including no impurity, etching selectivity of first and second layers 16a, 16b can be set large by using a fluoric acid solution so that only second layer 16b can selectively be removed.

Then, resist pattern 19a is formed on covering material 16 covering second core 13b.

If second layer 16b is etched in condition of using resist pattern 19a to selectively remove second layer 16b covering first core 13a and further resist pattern 19a is removed, as shown in FIG. 5E, a structure in which first core 13a is covered with first layer 16a and second core 13b is covered with first and second layers 16a, 16b is obtained.

Then, covering material 16 is etched by RIE until the upper surface of first and second cores 13a, 13b is exposed (overall etch-back) in such a way that covering material 16 is left on the side surface of first and second cores 13a, 13b.

The etching may be performed in parallel under conditions that first and second layers 16a, 16b are etched at the same rate or at almost the same rate or after etching selectivity of first and second layer 16a, 16b being secured, second layer 16b may be left on the sidewall of first layer 16a to subsequently leave first layer 16a on the side surface of first and second cores 13a, 13b.

Then, if first and second cores 13a, 13b are removed by wet etching or the like, as shown in FIG. 5F, sidewall mask 16' having a line-and-space pattern of the half-pitch 1 F (line width: 1 F, space width: 1 F) and composed of first layer 16a and sidewall mask 16' having a line-and-space pattern of the half-pitch 1.5 F (line width: 1.5 F, space width: 1.5 F) and composed of first and second layers 16a, 16b are formed.

Next, as shown in FIG. 5G, mask material (for example, an insulating material) 17 and mask material (for example, coating oxide) 18 are formed again on processed materials 11, 12. Subsequently, resist pattern 19b of line width 2 F is formed on mask materials 17, 18 by photolithography.

If mask materials 17, 18 are etched in condition of using resist pattern 19b and then resist pattern 19b is removed, resist pattern 19b is transferred to mask materials 17, 18. That is, as shown in FIG. 5H, mask materials 17, 18 have line width 2 F.

Figure 5I:
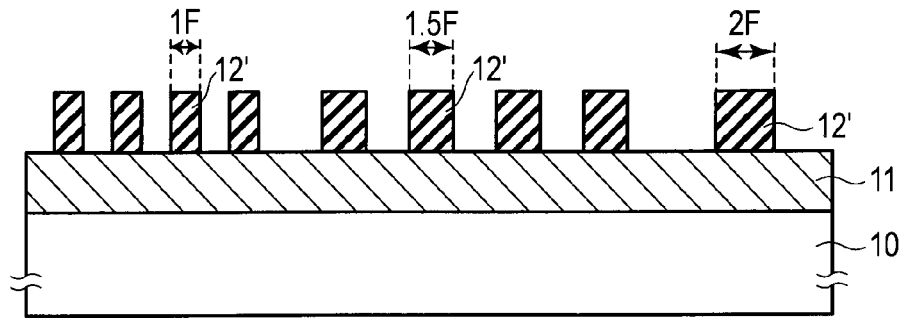

Then, if processed material 12 is etched by RIE in condition of using sidewall mask 16' and mask materials 17, 18 and then sidewall mask 16' and mask materials 17, 18 are removed, as shown in FIG. 5I, the processed material is processed to, for example, hard masks 12' having different line widths 1 F, 1.5 F, 2 F.

Figure 5J:
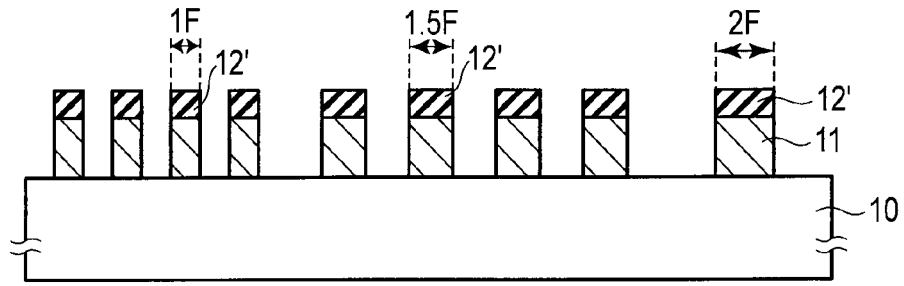

Lastly, as shown in FIG. 5J, processed material 11 is etched by RIE in condition of using hard mask 12'.

While covering material 16 is composed of a stacked layer comprising first and second layers 16a, 16b in the above example, if covering material 16 is composed of three layers, for example, amorphous silicon including impurities can be set as a lower layer, amorphous silicon including no impurity can be set as a middle layer, and $SiO_2$ can be set as the upper layer as a material example. In this case, $SiO_2$ of the upper layer can selectively be removed by a fluoric acid solution and the amorphous silicon including no impurity of the middle layer can selectively be removed by an alkaline solution.

FIGS. 6A to 6I show the method of manufacturing of the second embodiment.

Here, an example in which a pattern of line width W1 (=1 F) and a pattern of line width W2 (2 F≤W2) are formed in parallel by the sidewall mask process when the minimum processing size by photolithography is 2 F.

Figure 6A:
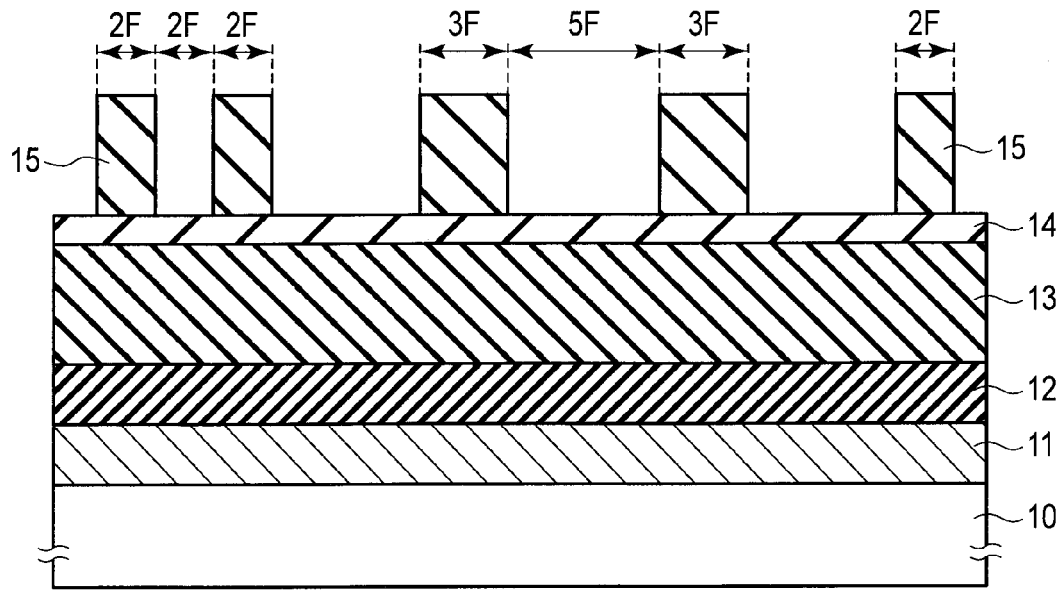

First, as shown in FIG. 6A, processed materials 11, 12 are formed on semiconductor substrate 10.

In this example, an example of processed materials 11, 12 will be described, but semiconductor substrate 10 may also be patterned as a processed material together with processed materials 11, 12 or semiconductor substrate 10 may be patterned as a processed material by omitting processed materials 11, 12.

Processed materials 11, 12 may be conductive materials or insulating materials. Processed materials 11, 12 may also be resistors (including variable resistors). Each of processed materials 11, 12 may further be composed of layers.

Subsequently, core 13 and antireflection material 14 are formed on processed materials 11, 12.

Core 13 is constituted of, for example, TEOS, $SiO_2$, SiN, C or the like. The material and thickness of core 13 are decided in consideration of etching selectivity with respect to processed materials 11, 12 and covering materials 16a, 16b (FIG. 5D).

Then, resist pattern 15 of line width 2 F and the space width 2 F, resist pattern 15 of line width 3 F and the space width 5 F, and single resist pattern 15 of line width 2 F are formed on antireflection material 14 by photolithography.

If resist pattern 15 is removed after antireflection material 14 and core 13 being etched in condition of using resist pattern 15 and further antireflection material 14 is removed, resist pattern 15 is transferred to core 13. That is, as shown in FIG. 6B, first core 13a has a pattern of line width 2 F and the space width 2 F, second core 13b has a pattern of line width 3 F and the space width 5 F, and third core 13c has a pattern of line width 2 F.

Next, as shown in FIG. 6C, slimming processing of first, second, and third cores 13a, 13b, 13c is performed to set the line width of first core 13a to 1 F and the space width thereof to 3 F, the line width of second core 13b to 2 F and the space width thereof to 6 F and the line width of third core 13c to 2 F.

The slimming processing is performed by wet etching, dry etching, or a combination of wet etching and dry etching.

In the present example, antireflection material 14 and resist pattern 15 in FIG. 6A are removed before the slimming processing, but may also be removed after the slimming processing. Antireflection material 14 and resist pattern 15 in FIG. 6A are removed by, for example, $O_2$ plasma etching. Antireflection material 14 and resist pattern 15 in FIG. 6A may be removed in parallel or separately.

Figure 6D:
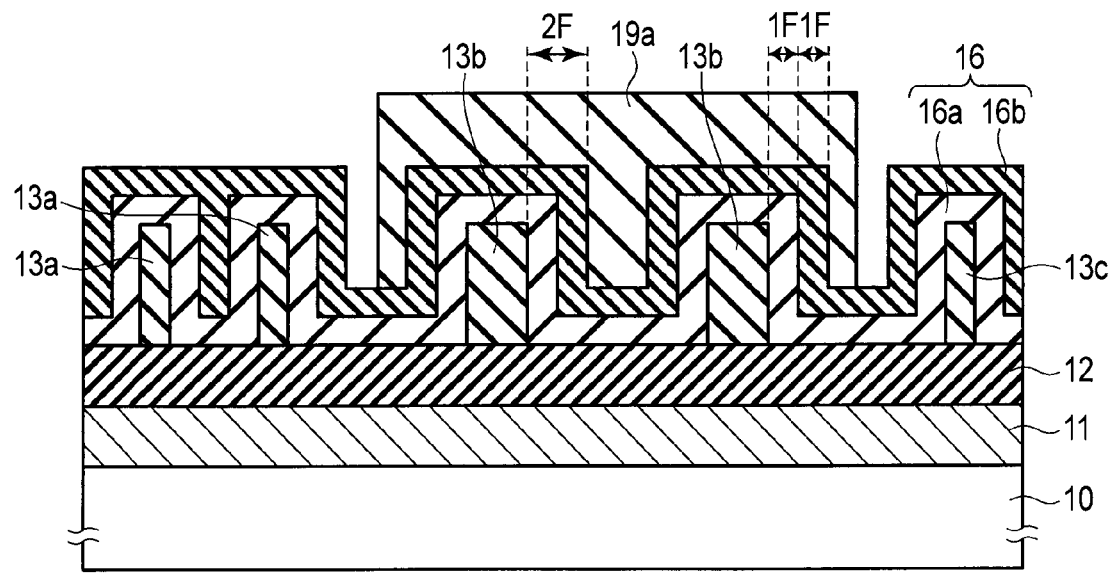

Next, as shown in FIG. 6D, covering material 16 covering the upper surface and side surface of first, second, and third cores 13a, 13b, 13c is formed. Covering material 16 is constituted of two layers or more. In the present example, covering material 16 is composed of first layer 16a and second layer 16b.

The thickness of first layer 16a is 1 F and the thickness of second layer 16b is 1 F. First layer 16a and second layer 16b are constituted of different materials having etching selectivity. As described above, it is necessary for first and second layers 16a, 16b to have etching selectivity also with respect to core 13 and processed materials 11, 12.

For example, one of first and second layers 16a, 16b is amorphous silicon including impurities (for example, boron) and the other is amorphous silicon including no impurity. If covering material 16 has a stacked structure of three layers or more including first and second layers 16a, 16b, it is desirable for each layer of the stacked structure to be one selected from amorphous silicon including impurities, amorphous silicon including no impurity, and an insulating material.

If second layer 16b of covering layer 16 is amorphous silicon including no impurity and first layer 16a of covering layer 16 is amorphous silicon including impurities, etching selectivity of first and second layers 16a, 16b can be set large by using an alkaline solution so that only second layer 16b can selectively be removed.

If second layer 16b of covering layer 16 is $SiO_2$ and first layer 16a of covering layer 16 is amorphous silicon including impurities or amorphous silicon including no impurity, etching selectivity of first and second layers 16a, 16b can be set large by using a fluoric acid solution so that only second layer 16b can selectively be removed.

Then, resist pattern 19a is formed on covering material 16 covering second core 13b.

Figure 6E:
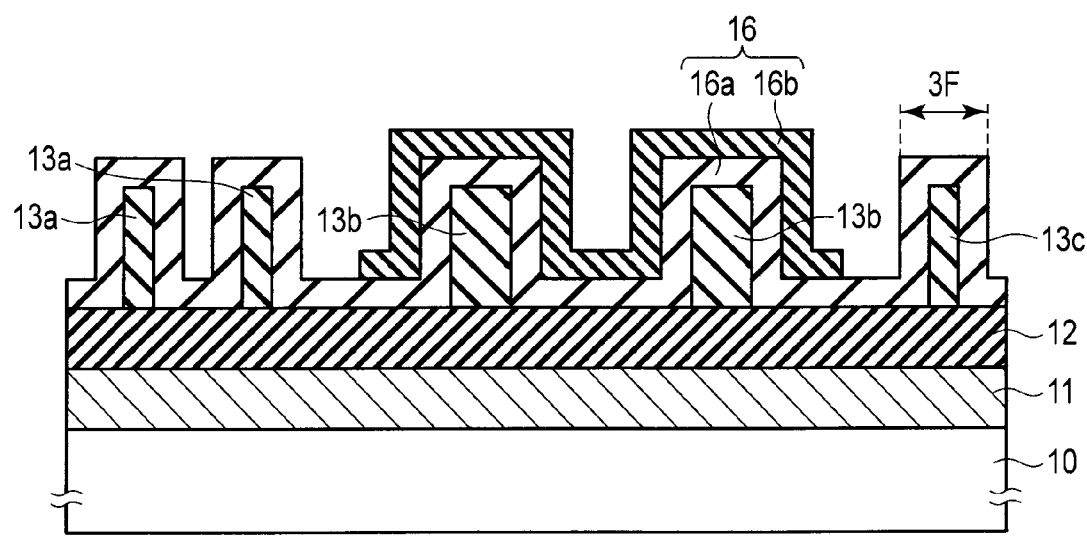

If second layer 16b is etched in condition of using resist pattern 19a to selectively remove second layer 16b covering first and third cores 13a, 13c and further resist pattern 19a is removed, as shown in FIG. 6E, a structure in which first and third cores 13a, 13c are covered with first layer 16a and second core 13b is covered with first and second layers 16a, 16b is obtained.

Then, covering material 16 is etched by RIE (overall etch-back) in such a way that covering material 16 is left on the side surface of first, second, and third cores 13a, 13b, 13c.

Next, as shown in FIG. 6F, resist pattern 19c to cover third core 13c and first layer 16a on the side surface thereof is formed.

Then, if first and second cores 13a, 13b are removed by wet etching or the like and also resist pattern 19c is removed, as shown in FIG. 6G, sidewall mask 16' having a line-and-space pattern of the half-pitch 1 F (line width: 1 F, space width: 1 F) and composed of first layer 16a and sidewall mask 16' having a line-and-space pattern of the half-pitch 2 F (line width: 2 F, space width: 2 F) and composed of first and second layers 16a, 16b are formed.

Further, mask material 16' having line width 3 F and composed of third core 13c and first layer 16a is formed.

In the present example, a pattern (mask material 16') of line width 3 F can be formed without new photolithographic processes (for example, FIGS. 5G and 5H). That is, it is possible to adopt sidewall mask 16' for patterns of line widths 1 F, 2 F greatly affected by line width roughness and mask material 16' using third core 13c and first layer 16a for patterns of line width 3 F less affected by line width roughness.

Then, if processed material 12 is etched by RIE in condition of using sidewall mask 16' and mask material 16' and then sidewall mask 16' and mask material 16' are removed, as shown in FIG. 6H, the processed material is processed to hard mask 12' having, for example, different line widths 1 F, 2 F, 3 F.

Lastly, as shown in FIG. 6I, processed material 11 is etched by RIE in condition of using hard mask 12'.

While covering material 16 is composed of a stacked layer comprising first and second layers 16a, 16b in the above example, if covering material 16 is composed of three layers, for example, amorphous silicon including impurities can be set as a lower layer, amorphous silicon including no impurity can be set as a middle layer, and $SiO_2$ can be set as the upper layer as a material example. In this case, $SiO_2$ of the upper layer can selectively be removed by a fluoric acid solution and the amorphous silicon including no impurity of the middle layer can selectively be removed by an alkaline solution.

Figure 7:
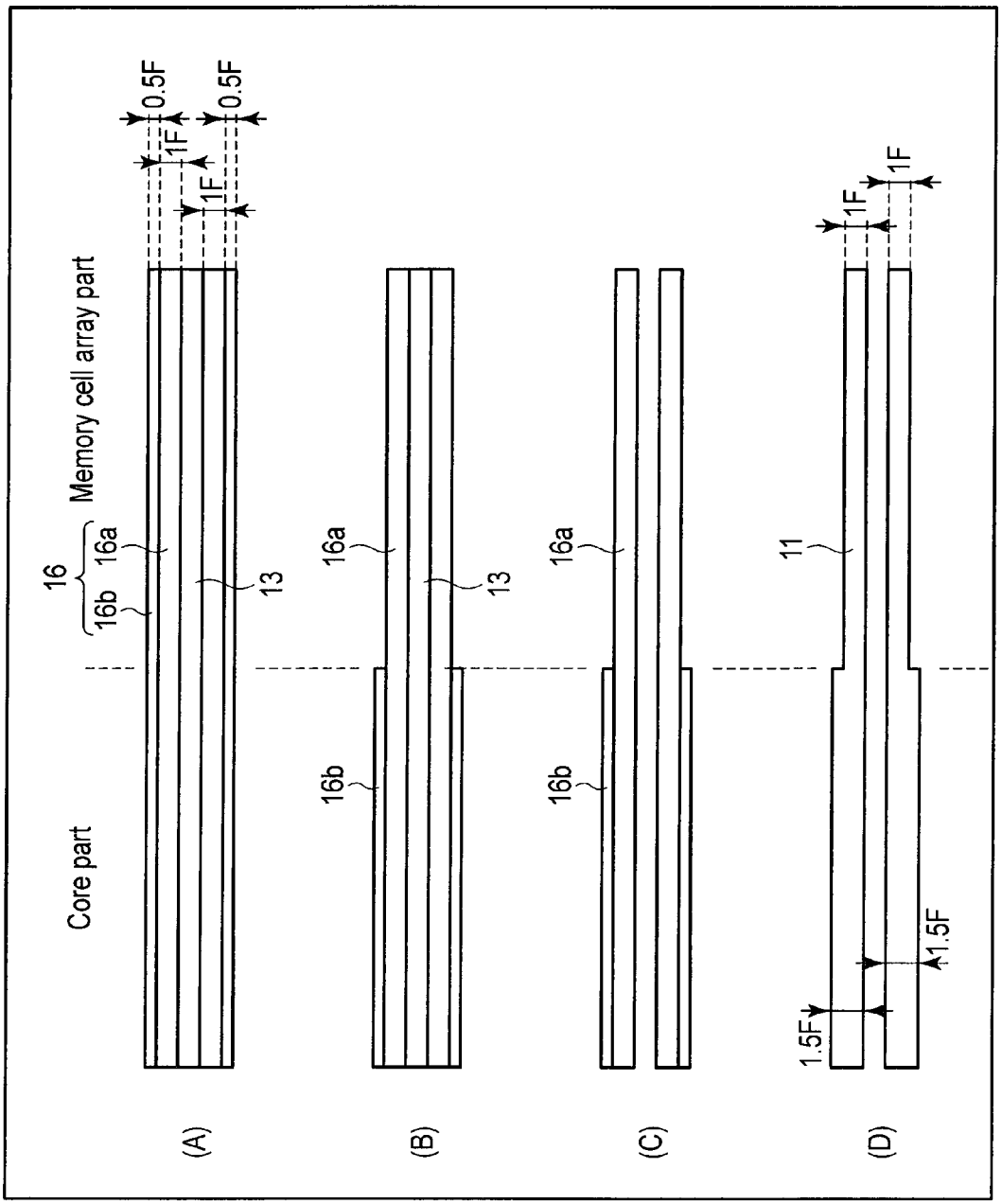
FIG. 7 is a diagram showing the method of manufacturing of a third embodiment.

FIG. 7 shows the method of manufacturing of the third embodiment.

The present embodiment relates to a method of forming one pattern (for example, a line pattern) having different widths. The concrete procedure for the method of manufacture is the same as the procedure in the first embodiment (FIGS. 5A to 5J) or the second embodiment (FIGS. 6A to 6I).

First, core 13 having a first part (memory cell array part) and a second part (core part) is formed on a processed material. Further, covering material 16 having first and second layers 16a, 16b covering the upper surface and side surface of core 13 is formed. Then, second layer 16b covering the first part of core 13 is removed.

Next, a first sidewall mask having first layer 16a is formed on the side surface of the first part of core 13 and a second sidewall mask having first and second layers 16a, 16b is formed on the side surface of the second part of core 13 by etching covering material 16. Then, core 13 is removed.

Lastly, in condition of using the first and second sidewall masks, one pattern having different widths is formed by etching the processed material of a lower layer than the first and second sidewall masks. For example, a pattern having line width 1 F in the memory cell array part and line width 1.5 F in the core part is formed.

FIG. 8 shows a plan view of a semiconductor device as a first application example.

The semiconductor device relates to a next-generation memory such as MRAM and ReRAM. In such a semiconductor memory, a memory cell in the memory cell array part is composed of, for example, one FET T0 and one memory element ME.

By applying the sidewall mask process according to an embodiment, active area (width 1 F) AA0 of the memory cell array part, active area (width 1.5 F) AA1 of the core part, and active area (width 2 F) AA2 of the peripheral circuit part can be formed.

The sidewall mask process according to an embodiment can also be applied to bit lines UBL, LBL extending from the memory cell array part to the core part.

Further, the sidewall mask process according to an embodiment can be applied to word line (gate electrode of FET T0) G0 of the memory cell array part, gate electrode G1 of FET T1 of the core part, and gate electrode G2 of FET T2 of the peripheral circuit part.

FIG. 9 shows a plan view of the semiconductor device as a second application example.

The semiconductor device relates to a NAND flash memory.

By applying the sidewall mask process according to an embodiment, active area (width 1 F) AA0 of the memory cell array part, active area (width 1.5 F) AA1 of the core part, and active area (width 2 F) AA2 of the peripheral circuit part can be formed.

The sidewall mask process according to an embodiment can also be applied to word line (gate electrode of FET T0) G0 of the memory cell array part, gate electrode G1 of FET T1 of the core part, and gate electrode G2 of FET T2 of the peripheral circuit part.

Each of bit lines UBL, LBL in FIG. 8 and Word line WL in FIG. 9 is connected to memory cells, and is a first conductive line having a size smaller than a minimum processing size by photolithography. A select transistor, for example, FET (Field effect transistor) is connected between the memory cells connected in series and the first conductive line.

FET T1 in the core part in FIGS. 8 and 9 is connected to a second conductive line having a size smaller than the minimum processing size and has a width different from a width of the first conductive line. The first and second conductive lines are provided in the same layer, and connected to each other.

According to the embodiments described above, patterns having different widths can be formed in parallel by the sidewall mask process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
    forming first and second cores on a processed material;
    forming a covering material having a stacked layer comprising first and second layers, the covering material covering an upper surface and a side surface of each of the first and second cores;
    removing the second layer covering the first core;
    forming a first sidewall mask having the first layer on the side surface of the first core and a second sidewall mask having the first and second layers on the side surface of the second core by etching the covering material to expose a surface of the processed material;
    removing the first and second cores; and
    forming first and second patterns having a first width W1 and a second width W2 in parallel by etching the processed material in condition of using the first and second sidewall masks.

2. The method of claim 1,
    wherein the width W1 of the first sidewall mask is 1 F and the second width W2 of the second sidewall mask is 1 F<W2<2 F, where 2 F is a minimum processing size by photolithography.

3. The method of claim 1,
    wherein the width W1 of the first sidewall mask is 1 F and the second width W2 of the second sidewall mask is 2 F≤W2, where 2 F is a minimum processing size by photolithography.

4. The method of claim 1,
    wherein the device includes a memory cell array part, a core part adjacent to the memory cell array part, and a peripheral circuit part surrounding the memory cell array part and the core part,
    the first sidewall mask is used for patterning of the memory cell array part, and
    the second sidewall mask is used for patterning of the core part arranged around the memory cell array part.

5. The method of claim 1,
    wherein the first and second patterns are used as a hard mask.

6. The method of claim 1,
    wherein the first and second patterns are used for patterning of an active area and a conductive line having a line-and-space pattern.

7. The method of claim 1,
    wherein the second pattern is used for patterning of a gate electrode of a FET.

8. The method of claim 1,
    wherein one of the first and second layers is amorphous silicon including impurities and the other is amorphous silicon including no impurity.

9. The method of claim 1,
    wherein the covering material has a stacked structure of three layers or more including the first and second layers and each layer of the stacked structure is one of amorphous silicon including impurities, amorphous silicon including no impurity, and an insulating material.

10. A method of manufacturing a semiconductor device, the method comprising:
    forming a core having first and second parts on a processed material;
    forming a covering material having a stacked layer comprising first and second layers, the covering material covering an upper surface and a side surface of the core;
    removing the second layer covering the first part of the core;
    forming a first sidewall mask having the first layer on the side surface of the first part of the core and a second sidewall mask having the first and second layers on the side surface of the second part of the core by etching the covering material to expose a surface of the processed material;
    removing the core; and
    forming a pattern having a first width of W1 and a second width of W2 by etching the processed material in condition of using the first and second sidewall masks.

11. The method of claim 10,
    wherein the width W1 of the first sidewall mask is 1 F and the width W2 of the second sidewall mask is 1 F<W2<2 F, where 2 F is a minimum processing size by photolithography.

12. The method of claim 10,
    wherein the width W1 of the first sidewall mask is 1 F and the width W2 of the second sidewall mask is 2 F≤W2, where 2 F is a minimum processing size by photolithography.

13. The method of claim 10,
    wherein the device includes a memory cell array part, a core part adjacent to the memory cell array part, and a peripheral circuit part surrounding the memory cell array part and the core part,
    the first sidewall mask is used for patterning of the memory cell array part, and
    the second sidewall mask is used for patterning of the core part arranged around the memory cell array part.

14. The method of claim 10,
    wherein the pattern is used as a hard mask.

15. The method of claim 10,
    wherein the pattern is used for patterning of an active area and a conductive line having a line-and space pattern.

16. The method of claim 10,
    wherein the pattern is used for patterning of a gate electrode of a FET.

17. The method of claim 10,
    wherein one of the first and second layers is amorphous silicon including impurities and the other is amorphous silicon including no impurity.

18. The method of claim 10,
    wherein the covering material has a stacked structure of three layers or more including the first and second layers and each layer of the stacked structure is one of amorphous silicon including impurities, amorphous silicon including no impurity, and an insulating material.

* * * * *

UNITED STATES PATENT AND TRADEMARK OFFICE
CERTIFICATE OF CORRECTION

| | |
|---|---|
| PATENT NO. | : 8,785,325 B2 |
| APPLICATION NO. | : 13/233379 |
| DATED | : July 22, 2014 |
| INVENTOR(S) | : Sudo |

Page 1 of 1

It is certified that error appears in the above-identified patent and that said Letters Patent is hereby corrected as shown below:

In the Claims,

Claim 2, column 9, lines 40-42, change "wherein the width W1 of the first sidewall mask is 1 F and the second width W2 of the second sidewall mask is 1 F<W2<2 F, where 2 F is" to --wherein the width W1 of the first sidewall mask is 1F and the second width W2 of the second sidewall mask is 1F<W2<2F, where 2F is--.

Claim 3, column 9, lines 45-47, change "wherein the width W1 of the first sidewall mask is 1 F and the second width W2 of the second sidewall mask is 2 F $\leq$ W2, where 2 F is" to --wherein the width W1 of the first sidewall mask is 1F and the second width W2 of the second sidewall mask is 2F $\leq$ W2, where 2F is--.

Claim 11, column 10, lines 33-35, change "wherein the width W1 of the first sidewall mask is 1 F and the width W2 of the second sidewall mask is 1 F<W2<2 F, where 2 F is" to --wherein the width W1 of the first sidewall mask is 1F and the width W2 of the second sidewall mask is 1F<W2<2F, where 2F is--.

Claim 12, column 10, lines 38-40, change "wherein the width W1 of the first sidewall mask is 1 F and the width W2 of the second sidewall mask is 2 F $\leq$ W2, where 2 F is" to --wherein the width W1 of the first sidewall mask is 1F and the width W2 of the second sidewall mask is 2F $\leq$ W2, where 2F is--.

Signed and Sealed this
Eighteenth Day of November, 2014

Michelle K. Lee
*Deputy Director of the United States Patent and Trademark Office*